United States Patent
Han et al.

(10) Patent No.: US 9,978,514 B2
(45) Date of Patent: *May 22, 2018

(54) MULTILAYER CERAMIC ELECTRONIC COMPONENT AND BOARD FOR MOUNTING THE SAME

(71) Applicant: SAMSUNG ELECTRO-MECHANICS CO., LTD., Suwon, Gyunggi-do, (KR)

(72) Inventors: Byung Woo Han, Gyunggi-do (KR); Dae Bok Oh, Gyunggi-do (KR); Jae Yeol Choi, Gyunggi-Do (KR); Sang Huk Kim, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 617 days.

This patent is subject to a terminal disclaimer.

(21) Appl. No.: 14/080,517

(22) Filed: Nov. 14, 2013

(65) Prior Publication Data
US 2014/0311789 A1 Oct. 23, 2014

(30) Foreign Application Priority Data

Apr. 22, 2013 (KR) .......................... 10-2013-0044150
Aug. 20, 2013 (KR) .......................... 10-2013-0098576

(51) Int. Cl.
*H01G 2/06* (2006.01)
*H01G 4/30* (2006.01)
(Continued)

(52) U.S. Cl.
CPC ................. *H01G 2/06* (2013.01); *H01G 4/12* (2013.01); *H01G 4/232* (2013.01); *H01G 4/30* (2013.01);
(Continued)

(58) Field of Classification Search
CPC .. H01G 4/06; H01G 4/08; H01G 4/10; H01G 4/30; H01G 4/12; H01G 4/232;
(Continued)

(56) References Cited

U.S. PATENT DOCUMENTS 3,444,436 A * 5/1969 Coda .................... H01G 2/04
361/306.3
4,733,327 A * 3/1988 Behn .................... H01G 4/30
29/25.42

(Continued)

FOREIGN PATENT DOCUMENTS

CN 1612272 A 5/2005
CN 102956354 A 3/2013
(Continued)

OTHER PUBLICATIONS

First Office Action Chinese Patent Application No. 201310629646.1 dated May 2, 2017 with full English translation.

(Continued)

*Primary Examiner* — Ishwarbhai B Patel
*Assistant Examiner* — Paresh Paghadal
(74) *Attorney, Agent, or Firm* — McDermott Will & Emery LLP

(57) ABSTRACT

There is provided a multilayer ceramic electronic component including, a ceramic body including a plurality of dielectric layers stacked in a thickness direction, satisfying T/W>1.0 when a width and a thickness thereof are defined as W and T, respectively, and having a groove portion inwardly recessed in a length direction in at least one main surface thereof, a plurality of first and second internal electrodes disposed in the ceramic body to face each other, having the dielectric layers interposed therebetween, and alternately exposed through both end surfaces of the ceramic body, and first and second external electrodes formed to
(Continued)

extend from the both end surfaces of the ceramic body to the at least one main surface having the groove portion formed therein.

8 Claims, 7 Drawing Sheets

(51) Int. Cl.
  H05K 1/16 (2006.01)
  H01G 4/12 (2006.01)
  H01G 4/232 (2006.01)
  H05K 1/18 (2006.01)
  H05K 3/34 (2006.01)

(52) U.S. Cl.
  CPC ............. *H05K 1/162* (2013.01); *H05K 1/185* (2013.01); *H05K 1/16* (2013.01); *H05K 1/18* (2013.01); *H05K 1/181* (2013.01); *H05K 1/183* (2013.01); *H05K 3/3442* (2013.01); *H05K 2201/10015* (2013.01); *H05K 2201/10454* (2013.01); *H05K 2201/10636* (2013.01); *Y02P 70/611* (2015.11)

(58) Field of Classification Search
  CPC .......... H05K 2201/10015; H05K 2201/10454; H05K 2201/10636
  See application file for complete search history.

(56) References Cited

U.S. PATENT DOCUMENTS

| | | | | |
|---|---|---|---|---|
| 5,034,851 | A | * | 7/1991 | Monsorno ............. H01G 4/255 29/25.42 |
| 6,912,115 | B2 | | 6/2005 | Kobayashi et al. |
| 2005/0088803 | A1 | | 4/2005 | Umeda et al. |
| 2005/0094350 | A1 | * | 5/2005 | Kobayashi ............... H01G 4/30 361/306.3 |
| 2005/0264975 | A1 | * | 12/2005 | Yamazaki ................ H01C 1/02 361/301.1 |
| 2011/0024175 | A1 | * | 2/2011 | Satou ..................... H01G 2/065 174/260 |
| 2012/0147516 | A1 | | 6/2012 | Kim et al. |
| 2013/0038979 | A1 | | 2/2013 | Togashi |
| 2013/0050894 | A1 | | 2/2013 | Ahn et al. |
| 2014/0326493 | A1 | * | 11/2014 | Lee .......................... H01G 4/01 174/260 |
| 2015/0027764 | A1 | * | 1/2015 | Lee .......................... H01G 4/30 174/260 |

FOREIGN PATENT DOCUMENTS

| | | |
|---|---|---|
| JP | 05-074644 A | 3/1993 |
| JP | 06-021238 U | 3/1994 |
| JP | 06-349669 A | 12/1994 |
| JP | 08-055752 A | 2/1996 |
| JP | 09-097735 A | 4/1997 |
| JP | 09-260206 A | 10/1997 |
| JP | 2005-129802 A | 5/2005 |
| JP | 2007-134375 A | 5/2007 |
| JP | 2012-124458 A | 6/2012 |
| JP | 2013-038332 A | 2/2013 |

OTHER PUBLICATIONS

Notice of Office Action Japanese Patent Application No. 2013-234089 dated Mar. 28, 2017 with full English translation.
Notice of Office Action Japanese Patent Application No. 2013-234089 dated Oct. 25, 2016 with full English translation.

* cited by examiner

"A"

US 9,978,514 B2

MULTILAYER CERAMIC ELECTRONIC COMPONENT AND BOARD FOR MOUNTING THE SAME

CROSS-REFERENCE TO RELATED APPLICATIONS

This application claims the benefit of Korean Patent Application Nos. 10-2013-0044150 filed on Apr. 22, 2013 and 10-2013-0098576 filed on Aug. 20, 2013, with the Korean Intellectual Property Office, the disclosure of which is incorporated herein by reference.

BACKGROUND OF THE INVENTION

Field of the Invention

The present invention relates to a multilayer ceramic electronic component and a board for mounting the same.

Description of the Related Art

In accordance with the recent trend for the miniaturization of electronic products, demand for a multilayer ceramic electronic component having a small size and high capacitance has increased.

Therefore, dielectric layers and internal electrodes have been thinned and stacked in increasing amounts through various methods. Recently, as a thickness of individual dielectric layers has been reduced, multilayer ceramic electronic components having increased amounts of stacked layers included therein have been manufactured.

Multilayer ceramic electronic components may be miniaturized, and the dielectric layers and internal electrodes may be thinned, such that the dielectric layers and internal electrodes have been stacked in increasing amounts in order to implement a high degree of capacitance.

However, in a case in which dielectric layers and internal electrodes are thinned and stacked in an increased amount, although a high capacitance multilayer ceramic electronic component may be realized, but the multilayer ceramic electronic component may have a thickness thereof larger than a width thereof, due to the increase in stacked layers.

As described above, when a multilayer ceramic electronic component has a thickness larger than a width, external electrodes provided on both end surfaces of the multilayer ceramic electronic component may generally have circumferential surfaces having round shapes. Therefore, when the multilayer ceramic electronic component is mounted on a printed circuit board, the multilayer ceramic electronic component may not be maintained in a state thereof in which it is initially mounted on the board, and may frequently topple over. Hence, a mounting failure rate of the multilayer ceramic electronic component is increased.

Patent Document 1 discloses a multilayer ceramic capacitor having a smaller size and higher capacitance. However, Patent Document 1 does not disclose an element or a method for solving a defect in which the multilayer ceramic capacitor topples over when being mounted on a printed circuit board.

RELATED ART DOCUMENT (Patent Document 1) Japanese Patent Laid-Open Publication No. JP 2005-129802

SUMMARY OF THE INVENTION

An aspect of the present invention provides a multilayer ceramic electronic component in which a defect such as a tendency to topple over when being mounted on a printed circuit board or the like is solved.

According to an aspect of the present invention, there is provided a multilayer ceramic electronic component including: a ceramic body including a plurality of dielectric layers stacked in a thickness direction, satisfying T/W>1.0 when a width and a thickness thereof are defined as W and T, respectively, and having a groove portion inwardly recessed in a length direction in at least one main surface thereof; a plurality of first and second internal electrodes disposed in the ceramic body to face each other, having the dielectric layers interposed therebetween, and alternately exposed through both end surfaces of the ceramic body; and first and second external electrodes formed to extend from the both end surfaces of the ceramic body to the at least one main surface having the groove portion formed therein, and electrically connected to the first and second internal electrodes, respectively.

According to another aspect of the present invention, there is provided a multilayer ceramic electronic component including: a ceramic body including a plurality of dielectric layers stacked in a width direction, satisfying T/W>1.0 when a width and a thickness thereof are defined as W and T, respectively, and having a groove portion inwardly recessed in a length direction in at least one main surface thereof; a plurality of first and second internal electrodes disposed in the ceramic body to face each other, having the dielectric layers interposed therebetween, and alternately exposed through both end surfaces of the ceramic body; and first and second external electrodes formed to extend from the both end surfaces of the ceramic body to the at least one main surface having the groove portion formed therein, and electrically connected to the first and second internal electrodes, respectively.

When a maximum height of the groove portion is defined as a and a width of the ceramic body is defined as b, $0.001 \leq a/b \leq 0.007$ may be satisfied.

The groove portion may include a plurality of groove portions formed in both main surfaces of the ceramic body to face each other.

When a margin portion of the ceramic body in the width direction is defined as c, $40\ \mu m \leq c \leq 500\ \mu m$ may be satisfied.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
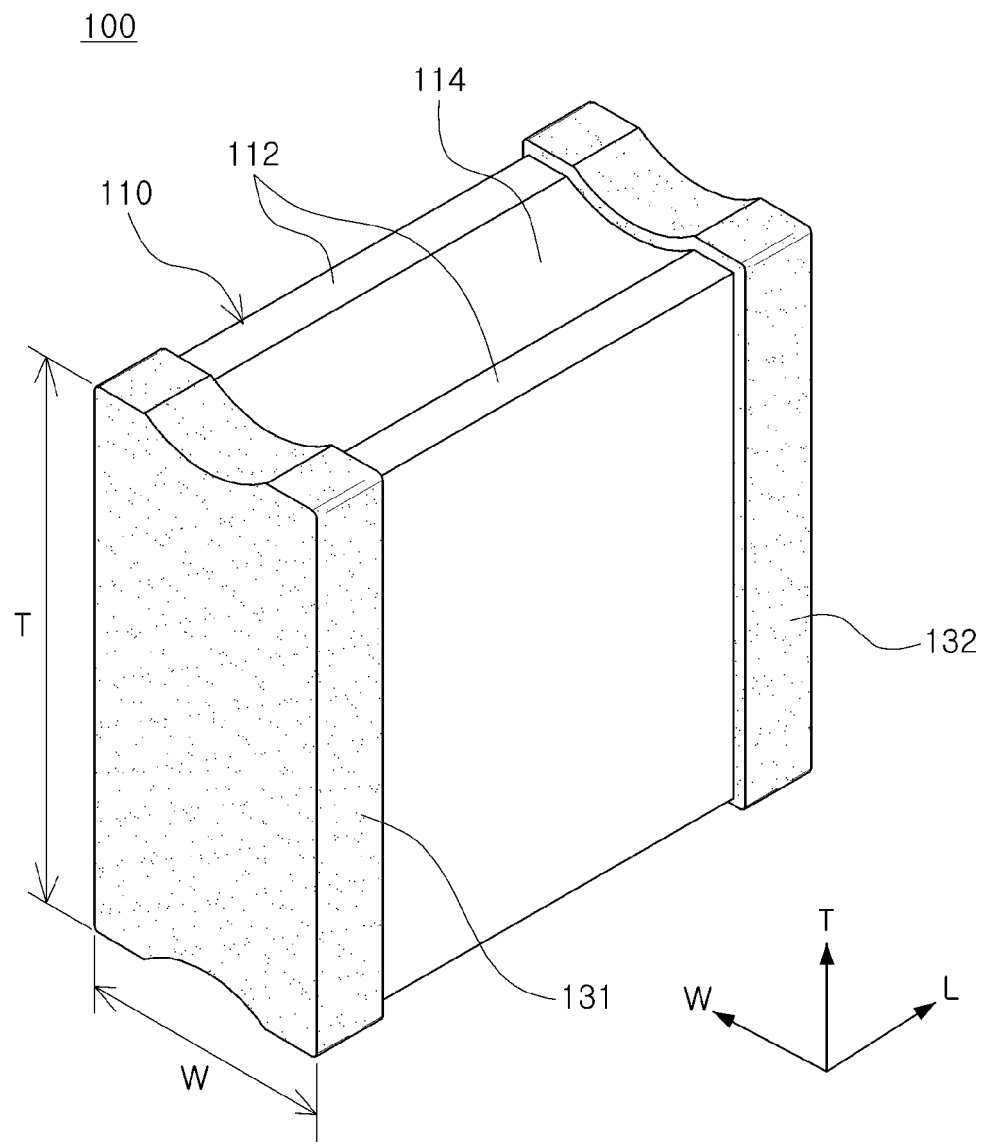
FIG. 1 is a perspective view schematically showing a multilayer ceramic capacitor according to an embodiment of the present invention.

Hereinafter, embodiments of the present invention will be described in detail with reference to the accompanying drawings.

The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

In the drawings, the shapes and dimensions of elements may be exaggerated for clarity.

In addition, the same reference numerals will be used throughout to designate the same or like elements.

Hereinafter, the multilayer ceramic electronic component according to an embodiment of the present invention will be described. Particularly, a multilayer ceramic capacitor will be described by way of example. However, the present invention is not limited thereto.

Multilayer Ceramic Capacitor

Figure 2:
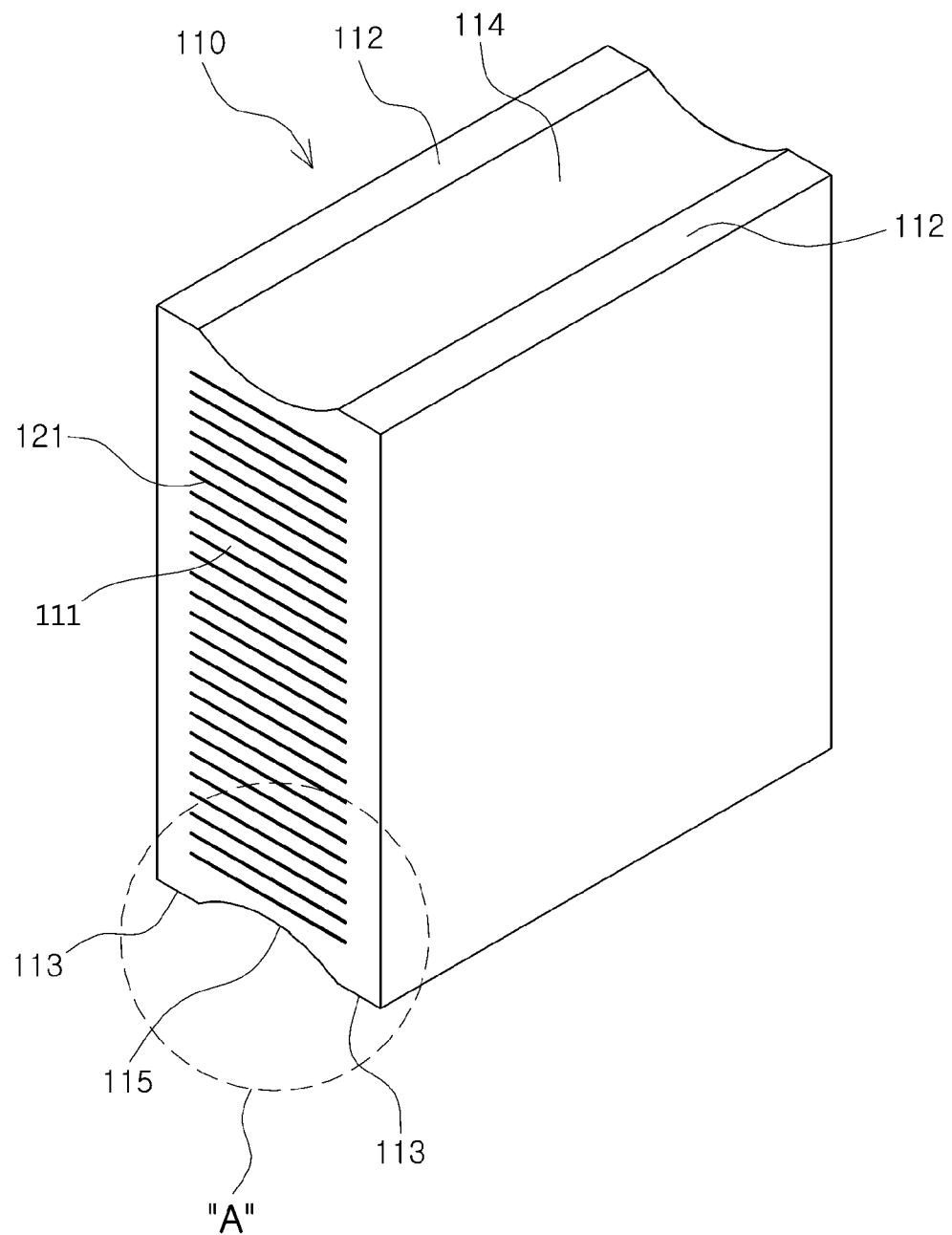
FIG. 2 is a perspective view showing a state in which external electrodes are separated from the multilayer ceramic capacitor of FIG. 1.

FIG. 1 is a perspective view schematically showing a multilayer ceramic capacitor according to an embodiment of the present invention. FIG. 2 is a perspective view showing a state in which external electrodes are separated from the multilayer ceramic capacitor of FIG. 1.

Referring to FIGS. 1 and 2, a multilayer ceramic capacitor 100 according to an embodiment of the present invention may include a ceramic body 110, a plurality of first and second internal electrodes 121 and 122, and first and second external electrodes 131 and 132.

The ceramic body 110 may be formed by stacking a plurality of dielectric layers 111 in a thickness direction and performing sintering, and the plurality of dielectric layers 111 may be integrated so as not to confirm boundaries between the adjacent dielectric layers without a scanning electron microscope (SEM).

The ceramic body 110 is not particularly limited in terms of the shape thereof and, for example, may have a hexahedral shape.

When defining directions of a hexahedron of the ceramic body 110 in order to clearly explain the embodiment of the present invention, L, W and T shown in the drawings refer to a length direction, a width direction and a thickness direction, respectively.

Furthermore, in the present embodiment, for the convenience of explanation, surfaces of the ceramic body 110 facing each other in a thickness direction are defined as first and second main surfaces, surfaces of the ceramic body 110 connecting the first and second main surfaces to each other and facing each other in a length direction are defined as first and second end surfaces, and surfaces of the ceramic body 110 facing each other in a width direction are defined as first and second side surfaces.

The ceramic body 110 may be formed by increasing the number of the dielectric layers 111 stacked therein in order to implement high capacitance, and when a width and a thickness of the ceramic body 110 are defined as W and T, respectively, $T/W>1.0$ is satisfied, such that the ceramic body 110 may have the thickness thereof lager than the width thereof.

When the second main surface of the ceramic body 110 is set as a mounting surface, the ceramic body 110 may have a groove portion 115 inwardly recessed in the length direction in the second main surface thereof.

Accordingly, the second main surface of the ceramic body 110 may be provided with support portions 113 formed at both sides thereof centered on the groove portion 115 and having a predetermined area, and the support portions 113 may serve as support legs preventing the multilayer ceramic capacitor 100 from unpredictably toppling over at the time of mounting the multilayer ceramic capacitor 100 on a printed circuit board, on the like.

In addition, the first main surface facing the second main surface of the ceramic body 110 may be provided with a groove portion 114 inwardly recessed in the length direction so as to face the groove portion 115 formed in the second main surface, as needed.

The first and second main surfaces of the ceramic body 110 may be formed in a symmetrical manner, such that the multilayer ceramic capacitor 100 may be mounted on a printed circuit board in a vertically inverted manner.

In this case, the first main surface of the ceramic body 110 may be provided with support portions 112 formed at both sides thereof centered on the groove portion 114 and corresponding to the support portions 113.

The dielectric layers 111 may include a ceramic material having a high dielectric constant, for example, a barium titanate ($BaTiO_3$) based ceramic powder. However, a material for the dielectric layers according to the embodiment of the present invention is not limited thereto, as long as a sufficient capacitance may be obtained thereby.

Furthermore, the dielectric layers 111 may include a ceramic powder and further include various types of ceramic additives such as a transition metal oxide or transition metal carbide, rare earth elements, and magnesium (Mg) or aluminum (Al), an organic solvent, a plasticizer, a binder and a dispersant, along with the ceramic powder.

Figure 3:
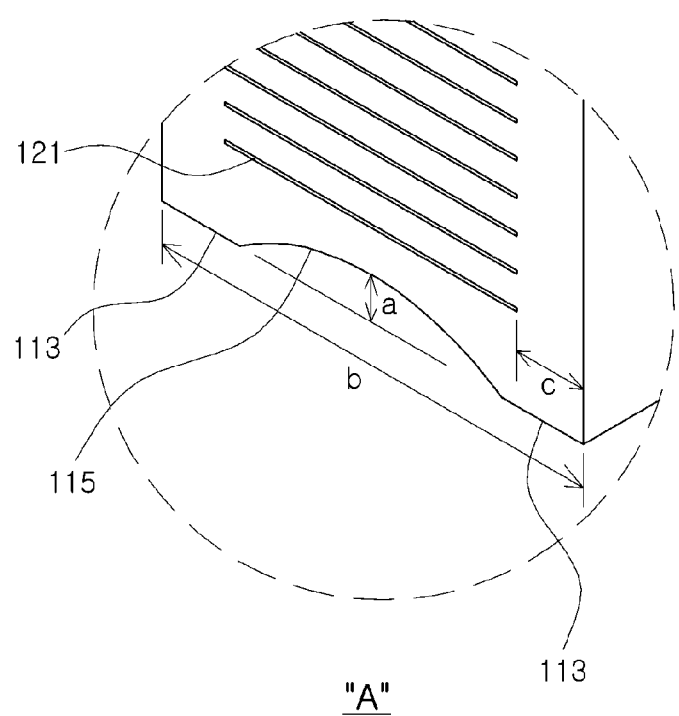
FIG. 3 is an enlarged perspective view of portion A of FIG. 2.

FIG. 3 is an enlarged perspective view of portion A of FIG. 2.

Referring to FIG. 3, when a maximum height of the groove portion 115 is defined as a and a width of the ceramic body 110 is defined as b, $0.001 \leq a/b \leq 0.007$ may be satisfied.

The following Table 1 shows whether or not multilayer ceramic capacitors toppled over when being mounted on a printed circuit board and whether or not reliability in the capacitors were satisfied, depending on a numerical value of a/b, that is, a shape of the mounting surface of the ceramic body 110.

TABLE 1

| Sample # | a/b | Whether or Not Multilayer ceramic Capacitor Topples Over | | Whether or Not Reliability is Satisfied |
|---|---|---|---|---|
| | | Frequency of Occurrence | Result | |
| 1 | −0.002 | 15/20 | NG | OK |
| 2 | −0.001 | 7/20 | NG | OK |
| 3 | 0.000 | 3/20 | NG | OK |
| 4 | 0.001 | 0/20 | OK | OK |
| 5 | 0.002 | 0/20 | OK | OK |
| 6 | 0.003 | 0/20 | OK | OK |
| 7 | 0.004 | 0/20 | OK | OK |
| 8 | 0.005 | 0/20 | OK | OK |
| 9 | 0.006 | 0/20 | OK | OK |
| 10 | 0.007 | 0/20 | OK | OK |

TABLE 1-continued

| Sample # | a/b | Whether or Not Multilayer ceramic Capacitor Topples Over Frequency of Occurrence | Result | Whether or Not Reliability is Satisfied |
|---|---|---|---|---|
| 11 | 0.008 | 0/20 | OK | NG |
| 12 | 0.009 | 0/20 | OK | NG |

Referring to Table 1, in the case of Samples 1 and 2 in which the mounting surface of the ceramic body, that is, the second main surface was downwardly convex, it could be confirmed that when the respective multilayer ceramic capacitors were mounted on the printed circuit board twenty times, the multilayer ceramic capacitors toppled over fifteen times and seven times, respectively, such that mounting defect rates were significantly high.

In addition, in the case of Sample 3 in which the mounting surface of the ceramic body, that is, the second main surface was flat, it could be confirmed that when the multilayer ceramic capacitor was mounted on the printed circuit board twenty times, the multilayer ceramic capacitor toppled over less times but three times less than those of Samples 1 and 2. This is because that the multilayer ceramic capacitor had a thickness larger than a width, such that the center of gravity of the ceramic body may be easily changed.

Further, in the case of Samples 4 to 10 in which the mounting surface of the ceramic body 110, that is, the second main surface had the groove portion 115 inwardly recessed in the length direction, it could be confirmed that when the multilayer ceramic capacitors 100 were mounted on the printed circuit board twenty times, the multilayer ceramic capacitors did not topple over.

Further, in the case of Samples 11 and 12 in which the mounting surface of the ceramic body, that is, the second main surface had a groove portion inwardly recessed in the length direction, it could be confirmed that when the multilayer ceramic capacitors were mounted on the printed circuit board twenty times, the multilayer ceramic capacitors did not topple over. However, the groove portion is excessively recessed, such that a margin portion of the ceramic body in the thickness direction was excessively thin, to deteriorate moisture-resistance reliability.

In addition, in a cross section in a width-thickness direction of the ceramic body 110, when a margin portion of the ceramic body 110 in the width direction is defined as c, 40 μm≤c≤500 μm may be satisfied.

The following Table 2 shows whether or not reliability in the capacitors were satisfied, depending on a numerical value of c, that is, a size of the margin portion of the ceramic body 110 in the width direction.

TABLE 2

| Sample # | c (μm) | Whether or Not Reliability is Satisfied |
|---|---|---|
| 1 | 30 | NG |
| 2 | 40 | OK |
| 3 | 50 | OK |
| 4 | 60 | OK |
| 5 | 70 | OK |
| 6 | 80 | OK |
| 7 | 90 | OK |
| 8 | 100 | OK |
| 9 | 110 | OK |
| 10 | 120 | OK |
| 11 | 130 | OK |
| 12 | 140 | OK |
| 13 | 200 | OK |
| 14 | 250 | OK |
| 15 | 300 | OK |
| 16 | 400 | OK |
| 17 | 500 | OK |

Referring to Table 2, in the case of Sample 1 in which the margin portion of the ceramic body 110 in the width direction was 30 μm, it could be confirmed that the margin portion of the ceramic body 110 in the width direction was excessively thin, to deteriorate moisture-resistance reliability.

Figure 4:
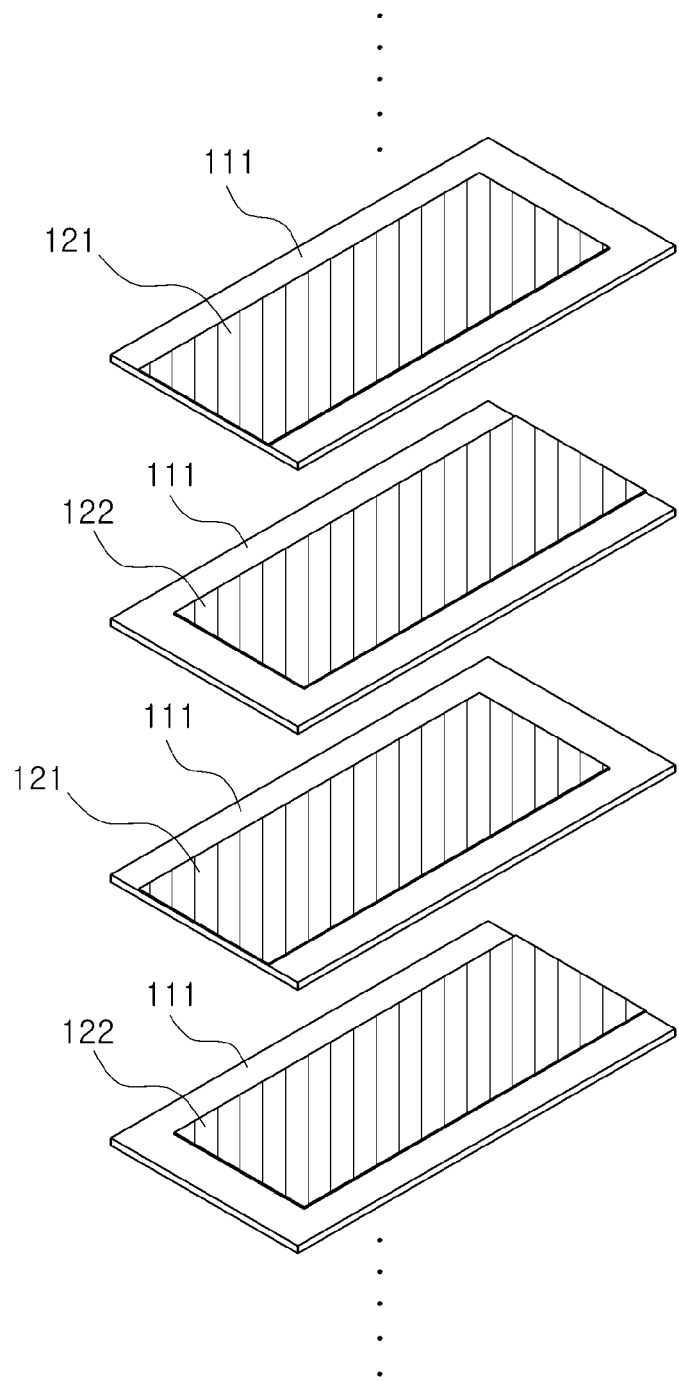
FIG. 4 is a perspective view showing first and second internal electrode structures of the multilayer ceramic capacitor according to the embodiment of the present invention.

FIG. 4 is a perspective view showing first and second internal electrode structures of the multilayer ceramic capacitor according to the embodiment of the present invention.

Referring to FIG. 4, the first and second internal electrodes 121 and 122 are electrodes having different polarities and disposed to face each other, having a ceramic sheet forming each dielectric layer 111 interposed therebetween. The first and second internal electrodes 121 and 122 may be formed in the ceramic body 110 to be exposed through the first and second end surfaces of the ceramic body 110.

In this case, the first and second internal electrodes 121 and 122 may be electrically insulated from each other by the respective dielectric layers 111 disposed therebetween.

Further, the first and second internal electrodes 121 and 122 are formed of a conductive metal, for example, one of silver (Ag), palladium (Pd), platinum (Pt), nickel (Ni), and copper (Cu) or an alloy thereof, however, the invention is not limited thereto.

The first and second external electrodes 131 and 132 may be extended from both end surfaces of the ceramic body 110 to the first and second main surfaces having the groove portions 114 and 115 formed in upper and lower portions of the ceramic body 110, respectively, and may cover portions of the plurality of first and second internal electrodes 121 and 122 exposed through the both end surfaces of the ceramic body 110, respectively, to be electrically connected to the first and second internal electrodes 121 and 122, respectively.

Further, the first and second external electrodes 131 and 132 are formed of a conductive metal, for example, silver (Ag), nickel (Ni), copper (Cu) or the like. The first and second external electrodes 31 and 32 may be formed by applying a conductive paste prepared by adding a glass frit to a conductive metal powder to outer surfaces of the ceramic body 110 and performing a sintering process. The present invention is not limited thereto.

On the other hand, first and second plating layers (not shown) may be formed on the first and second external electrodes 131 and 132, if necessary.

When the multilayer ceramic capacitor 100 is mounted on a printed circuit board through solder, the first and second plating layers are provided to improve adhesion therebetween.

The first and second plating layers include, for example nickel (Ni) plating layers formed on the first and second external electrodes 131 and 132 and tin (Sn) plating layers formed on the nickel plating layers, but the invention is not limited thereto.

Modified Example

Figure 5:
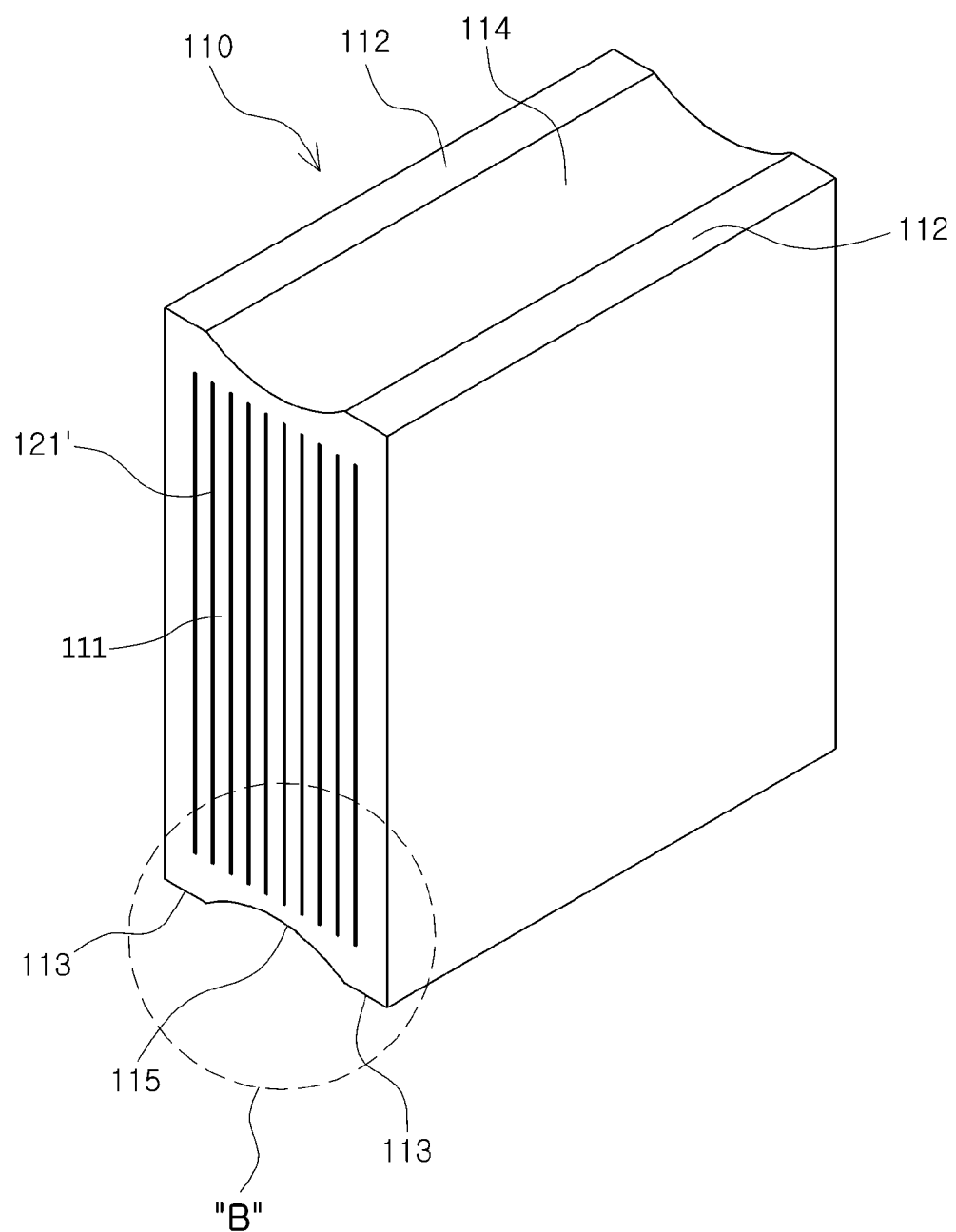
FIG. 5 is a perspective view showing a state in which external electrodes are separated from the multilayer ceramic capacitor according to another embodiment of the present invention.
Figure 6:
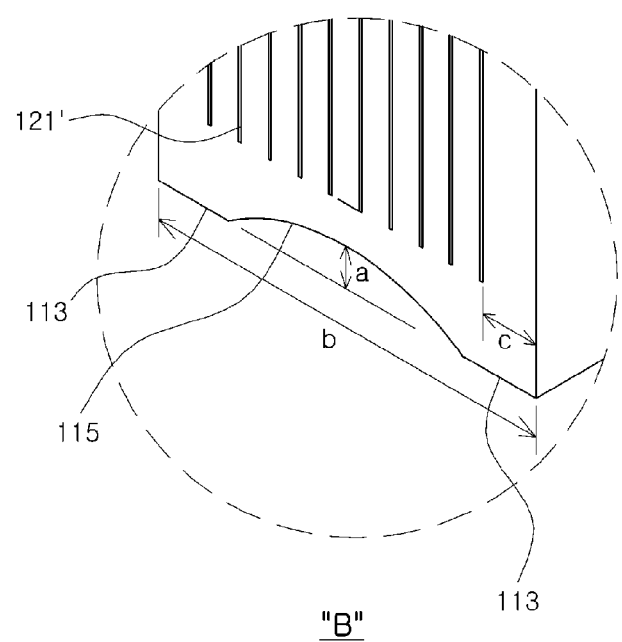
FIG. 6 is an enlarged perspective view of portion B of FIG. 5.

FIG. 5 is a perspective view showing a state in which external electrodes are separated from the multilayer ceramic capacitor according to another embodiment of the present invention. FIG. 6 is an enlarged perspective view of portion B of FIG. 5.

A structure in which the first and second external electrodes 131 and 132 are formed is identical to that of the forgoing embodiment, and a description thereof is not repeatedly described. Thus, a first internal electrode 121' and a second internal electrode (not shown) having a different structure from that of the forgoing embodiment will be described in detail.

Referring to FIG. 5, a multilayer ceramic capacitor 100' according to another embodiment of the present invention may include the ceramic body 110 including the plurality of the dielectric layers 111 stacked in the width direction.

Therefore, the first internal electrode 121' and the second internal electrode (not shown) may be disposed to face each other in the width direction, having a ceramic sheet forming each dielectric layer 111 interposed therebetween. The first internal electrode 121' and the second internal electrode (not shown) may be formed in the ceramic body 110 to be exposed through the first and second end surfaces of the ceramic body 110. Here, the first internal electrode 121' and the second internal electrode may be electrically insulated from each other by the dielectric layer 111 interposed therebetween.

Referring to FIG. 6, when a maximum height of the groove portion 115 is defined as a and a width of the ceramic body 110 is defined as b, $0.001 \leq a/b \leq 0.007$ may be satisfied. In addition, in a cross section in a width-thickness direction of the ceramic body 110, when a margin portion of the ceramic body 110 in the width direction is defined as c, $40 \mu m \leq c \leq 500 \mu m$ may be satisfied.

Method of Manufacturing Multilayer Ceramic Capacitor

Hereinafter, a method of manufacturing a multilayer ceramic capacitor according to the embodiment of the present invention will be described.

First, a plurality of ceramic sheets are prepared. The ceramic sheets are provided to form the dielectric layers 111 of the ceramic body 110 and may be formed to have sheet shapes each having a thickness of several micrometers (μm) by mixing a ceramic powder, a polymer, a solvent, and the like to prepare a slurry, applying the slurry on carrier films using a doctor blade method or the like, and drying the slurry.

Next, a plurality of internal electrode patterns are formed while having predetermined intervals therebetween in a length direction by printing a conductive paste at a predetermined thickness on at least one surface of the ceramic sheet.

The conductive paste may be printed using a screen printing method, a gravure printing method, or the like, in order to form the internal electrode patterns. The present invention is not limited thereto.

Next, the plurality of ceramic sheets having the internal electrode patterns formed thereon are stacked such that the internal electrode patterns are alternately disposed from each other in the thickness direction, and are pressurized in the stacking direction thereof, such that a stacked body may be prepared.

Next, the stacked body is cut for each region corresponding to a single capacitor having a 0603 (length×width) standard, such that chips each having a value of thickness/length larger than 1.0 are fabricated. The chips are fired at a high temperature and polished, to prepare the ceramic body 110 having the first and second internal electrodes 121 and 122.

Here, the first and second main surfaces of the stacked body are pressed, such that the groove portions 114 and 115 inwardly recessed in the length direction may be formed in the stacked body.

Then, the first and second external electrodes 131 and 132 are formed on both end surfaces in a thickness-length direction of the ceramic body 110 such that exposed portion of the first and second internal electrodes 121 and 122 are electrically connected thereto, respectively.

In addition, if necessary, after the first and second external electrodes 131 and 132 are formed, the surfaces of the first and second external electrodes 131 and 132 may be subjected to a plating treatment using electric plating or the like to form first and second plating layers (not shown).

Board for Mounting Multilayer Ceramic Capacitor

Figure 7:
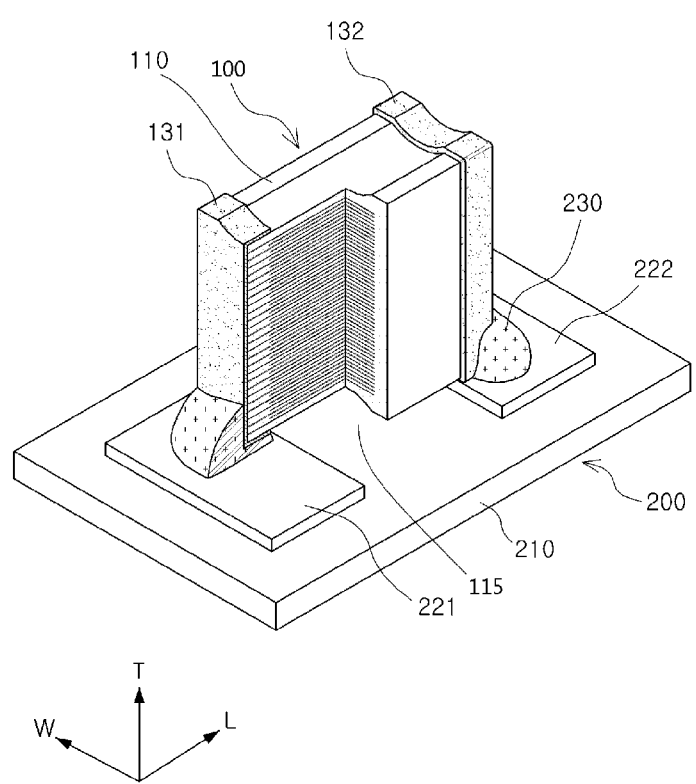
FIG. 7 is a partially cut-away perspective view of the multilayer ceramic capacitor according to the embodiment of the present invention, mounted on a printed circuit board.

FIG. 7 is a partially cut-away perspective view of the multilayer ceramic capacitor according to the embodiment of the present invention, mounted on a printed circuit board.

Referring to FIG. 7, a board 200 for mounting the multilayer ceramic capacitor 100 according to the embodiment of the present invention may include a printed circuit board 210 having the multilayer ceramic capacitor 100 mounted thereon horizontally or perpendicularly with respect to the printed circuit board 210; and first and second electrode pads 221 and 222 spaced apart from each other on an upper surface of the printed circuit board 210.

In the multilayer ceramic capacitor 100, the second main surface of the ceramic body 110 in the thickness direction, the second main surface having the groove portion 115 formed therein, may be provided as the mounting surface and disposed downwardly. The first and second external electrodes 131 and 132 of the multilayer ceramic capacitor 100 may be electrically connected to the printed circuit board 210 by a soldering part 230 while being positioned to contact the first and second electrode pads 221 and 222, respectively.

As set forth above, according to embodiments of the present invention, the multilayer ceramic electronic component may have the groove portion inwardly recessed in the length direction in the mounting surface of the ceramic body having a thickness larger than a width thereof, such that even in the case in which circumferential surfaces of the external electrodes are rounded, defects in which the multilayer ceramic electronic component topples over when being mounted on the printed circuit board, or the like, may be prevented to decrease mounting defect rates of the multilayer ceramic electronic component.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic electronic component comprising:
a ceramic body including a plurality of dielectric layers, satisfying T/W>1.0 when a width and a thickness thereof are defined as W and T, respectively, and having a first groove portion inwardly recessed in a length direction in a mounting surface of the ceramic body;
a plurality of first and second internal electrodes disposed in the ceramic body to face each other, having the dielectric layers interposed therebetween, and alternately exposed through both end surfaces of the ceramic body; and first and second external electrodes formed to extend from the both end surfaces of the ceramic body to the mounting surface having the first groove portion formed therein, having second and third groove portions, respectively, formed in a surface of the first and second external electrodes, respectively, corresponding to the mounting surface, and electrically connected to the first and second internal electrodes, respectively, wherein both end parts of the first groove portion extend to the both end surfaces of the ceramic body in the length direction, respectively, and wherein $0.001 \le a/b \le 0.007$ in which a is a maximum height of the first groove portion, and b is a width of the ceramic body.

2. The multilayer ceramic electronic component of claim 1, wherein a fourth groove portion is formed in a surface opposing the mounting surface of the ceramic body to face the first groove portion.

3. The multilayer ceramic electronic component of claim 1, wherein when a margin portion of the ceramic body in a width direction is defined as c, $40\ \mu m \le c \le 500\ \mu m$ is satisfied.

4. A board for mounting a multilayer ceramic electronic component, the board comprising:
- a printed circuit board having first and second electrode pads disposed thereon; and
- the multilayer ceramic electronic component of claim 1, disposed on the first and second electrode pads.

5. The multilayer ceramic electronic component of claim 1, wherein the plurality of dielectric layers are stacked in a thickness direction of the ceramic body such that the plurality of first and second internal electrodes face each other in the thickness direction.

6. The multilayer ceramic electronic component of claim 1, wherein the plurality of dielectric layers are stacked in a width direction of the ceramic body such that the plurality of first and second internal electrodes face each other in the width direction, and
- the plurality of first and second internal electrodes extend from a bottom portion of the ceramic body adjacent the mounting surface to a top portion of the ceramic body adjacent a surface opposing the mounting surface of the ceramic body.

7. A board for mounting a multilayer ceramic electronic component, the board comprising:
- a printed circuit board having first and second electrode pads disposed thereon; and
- the multilayer ceramic electronic component of claim 2, disposed on the first and second electrode pads.

8. A board for mounting a multilayer ceramic electronic component, the board comprising:
- a printed circuit board having first and second electrode pads disposed thereon; and
- the multilayer ceramic electronic component of claim 3, disposed on the first and second electrode pads.

* * * * *